United States Patent
Wang et al.

(10) Patent No.: US 8,455,858 B2
(45) Date of Patent: Jun. 4, 2013

(54) SEMICONDUCTOR STRUCTURE FOR REDUCING BAND-TO-BAND TUNNELING (BTBT) LEAKAGE

(75) Inventors: Jing Wang, Beijing (CN); Jun Xu, Beijing (CN); Lei Guo, Beijing (CN)

(73) Assignee: Tsinghua University (CN)

( * ) Notice: Subject to any disclaimer, the term of this patent is extended or adjusted under 35 U.S.C. 154(b) by 20 days.

(21) Appl. No.: 13/120,122

(22) PCT Filed: Nov. 8, 2010

(86) PCT No.: PCT/CN2010/078526
§ 371 (c)(1),
(2), (4) Date: Jul. 12, 2011

(87) PCT Pub. No.: WO2011/127727
PCT Pub. Date: Oct. 20, 2011

(65) Prior Publication Data
US 2011/0260173 A1 Oct. 27, 2011

(30) Foreign Application Priority Data
Apr. 16, 2010 (CN) .......................... 2010 1 0151192

(51) Int. Cl.
H01L 29/06 (2006.01)
H01L 31/0328 (2006.01)
H01L 31/0336 (2006.01)
H01L 31/072 (2006.01)
H01L 31/109 (2006.01)

(52) U.S. Cl.
USPC 257/18; 257/19; 257/E21.207; 257/E29.193; 257/E31.035; 257/E33.009

(58) Field of Classification Search
USPC ....... 257/18, 19, E21.207, E29.207, E31.035, 257/E33.009
See application file for complete search history.

(56) References Cited

U.S. PATENT DOCUMENTS 4,945,393 A * 7/1990 Beltram et al. .......... 365/185.06
5,302,840 A * 4/1994 Takikawa ...................... 257/194
(Continued)

FOREIGN PATENT DOCUMENTS

| CN | 1607677 A | 4/2005 |
| CN | 101819996 A | 9/2010 |
| CN | 1289149 A | 3/2011 |

OTHER PUBLICATIONS

Patent Cooperation Treaty; PCT International Search Report Issued in Connection with International Application No. PCT/CN2010/078526; Feb. 10, 2011; 4 pages.
(Continued)

Primary Examiner — Ida M Soward
(74) Attorney, Agent, or Firm — Greenberg Traurig, LLP

(57) ABSTRACT

A semiconductor structure is provided. The semiconductor structure may include a substrate (100); a buffer layer or an insulation layer (200) formed on the substrate; a first strained wide bandgap semiconductor material layer (400) formed on the buffer layer or the insulation layer; a strained narrow bandgap semiconductor material layer (500) formed on the first strained wide bandgap semiconductor material layer; a second strained wide bandgap semiconductor material layer (700) formed on the strained narrow bandgap semiconductor material layer; a gate stack (300) formed on the second strained wide bandgap semiconductor material layer; and a source and a drain (600) formed in the first strained wide bandgap semiconductor material layer, the strained narrow bandgap semiconductor material layer and the second strained wide bandgap semiconductor material layer respectively.

15 Claims, 2 Drawing Sheets

U.S. PATENT DOCUMENTS

| | | | | |
|---|---|---|---|---|
| 5,479,033 A * | 12/1995 | Baca et al. | | 257/192 |
| 5,480,829 A * | 1/1996 | Abrokwah et al. | | 438/169 |
| 6,326,667 B1 * | 12/2001 | Sugiyama et al. | | 257/347 |
| 6,350,993 B1 | 2/2002 | Chu et al. | | |
| 6,407,406 B1 * | 6/2002 | Tezuka | | 257/18 |
| 6,512,252 B1 * | 1/2003 | Takagi et al. | | 257/192 |
| 6,858,502 B2 | 2/2005 | Chu et al. | | |
| 6,927,414 B2 * | 8/2005 | Ouyang et al. | | 257/20 |
| 6,936,506 B1 * | 8/2005 | Buller et al. | | 438/197 |
| 6,949,761 B2 | 9/2005 | Chu et al. | | |
| 7,084,431 B2 | 8/2006 | Chu et al. | | |
| 7,282,402 B2 * | 10/2007 | Sadaka et al. | | 438/221 |
| 7,288,457 B2 * | 10/2007 | Kreps | | 438/285 |
| 7,387,925 B2 * | 6/2008 | Shang et al. | | 438/197 |
| 7,436,026 B2 * | 10/2008 | Kreps | | 257/344 |
| 7,560,326 B2 * | 7/2009 | Mocuta et al. | | 438/197 |
| 7,566,606 B2 * | 7/2009 | Currie et al. | | 438/199 |
| 7,612,366 B2 * | 11/2009 | Mears et al. | | 257/20 |
| 7,642,140 B2 * | 1/2010 | Bae et al. | | 438/151 |
| 7,659,539 B2 * | 2/2010 | Kreps et al. | | 257/28 |
| 2002/0105015 A1 * | 8/2002 | Kubo et al. | | 257/285 |
| 2002/0125475 A1 | 9/2002 | Chu et al. | | |
| 2004/0227154 A1 | 11/2004 | Chu et al. | | |
| 2005/0077510 A1 | 4/2005 | Chu et al. | | |
| 2008/0237637 A1 * | 10/2008 | Ouyang et al. | | 257/190 |

OTHER PUBLICATIONS

Abstract of CN 1607677A, entitled, Structure for and Method of Fabricating a High-Mobility Field-Effect Transistor; Apr. 20, 2005; 1 page; China.

Abstract of CN101819996A, entitled, Semiconductor Structure; Sep. 1, 2010; 2 pages; China.

Abstract of CN1289149A, entitled, High-Speed Composite P Channel si/siGe Heterogeneous Structure of Field-Effect Devices; Mar. 28, 2001; 1 page; China.

PCT International Search Report Issued in Connection with International Application No. PCT/CN2010/078526; Feb. 10, 2011; 4 pages.

* cited by examiner

SEMICONDUCTOR STRUCTURE FOR REDUCING BAND-TO-BAND TUNNELING (BTBT) LEAKAGE

CROSS-REFERENCE TO RELATED APPLICATIONS

This patent application is a §371 national stage patent application based on International Patent Application No. PCT/CN2010/078526, filed Nov. 8, 2010, entitled "SEMICONDUCTOR STRUCTURE," which claims priority to Chinese Patent Application Number 201010151192.8, filed on Apr. 16, 2010, which are both incorporated herein by reference in their entirety.

FIELD

The present disclosure relates to semiconductor manufacture and design, more particularly to a semiconductor structure for reducing band-to-band tunneling (BTBT) leakage of a MOS device.

BACKGROUND

With continuous development of the semiconductor manufacturing technology, leakage is a crucial and ineluctable problem. The bandgap of narrow bandgap semiconductor materials with high mobility is small. For example, the bandgap of Ge is about 0.67 eV, and the bandgap of InSb is about 0.18 eV. The bandgap of narrow bandgap semiconductor is material is much smaller than that of Si material. Therefore, with the use of the narrow bandgap semiconductor materials with high mobility, such as Ge, BTBT current leakage has rendered more serious than ever before.

In prior art, with the continuous reduction of the semiconductor device size and the use of narrow bandgap semiconductor materials, BTBT leakage becomes more serious.

SUMMARY

The present disclosure is aimed to solve at least one of the above mentioned technical problems, particularly BTBT leakage etc.

A semiconductor structure may be provided, which may effectively reduce BTBT leakage current. The semiconductor structure may comprise a substrate; a buffer layer or an insulation layer formed on the substrate; a first strained wide bandgap semiconductor material layer formed on the buffer layer or the insulation layer; a strained narrow bandgap semiconductor material layer formed on the first strained wide bandgap semiconductor material layer; a second strained wide bandgap semiconductor material layer formed on the strained narrow bandgap semiconductor material layer; a gate stack formed on the second strained wide bandgap semiconductor material layer; and a source and a drain formed in the first strained wide bandgap semiconductor material layer, the strained narrow bandgap semiconductor material layer and the second strained wide bandgap semiconductor material layer respectively. The semiconductor structure according to this aspect of the present disclosure not only may reduce the generation of two kinds of BTBT leakage, but also may generate a hole potential well in the strained narrow bandgap semiconductor material layer such as a strained Ge layer, thus increasing the mobility of the carriers and improving the performance of the semiconductor device.

According to another aspect of the present disclosure, a semiconductor structure may be provided. The semiconductor structure may comprise a substrate; a buffer layer or an insulation layer formed on the substrate; a first strained wide bandgap semiconductor material layer formed on the buffer layer or the insulation layer; a strained narrow bandgap semiconductor material layer formed on the first strained wide bandgap semiconductor is material layer; a gate stack formed on the second strained wide bandgap semiconductor material layer; and a source and a drain formed in the first strained wide bandgap semiconductor material layer and the strained narrow bandgap semiconductor material layer respectively. In the semiconductor structure according to this aspect of the present disclosure, by adding the first strained wide bandgap semiconductor material layer, such as a strained Si layer, in the semiconductor, BTBT leakage generated at the source/drain junction when the drain is applied with high bias voltage may be effectively reduced, thus reducing the influence of BTBT leakage. In addition, this kind of BTBT leakage may be also effectively reduced by the insulation layer formed below the first strained wide bandgap semiconductor material layer.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION OF EMBODIMENTS OF THE INVENTION

Figure 1:
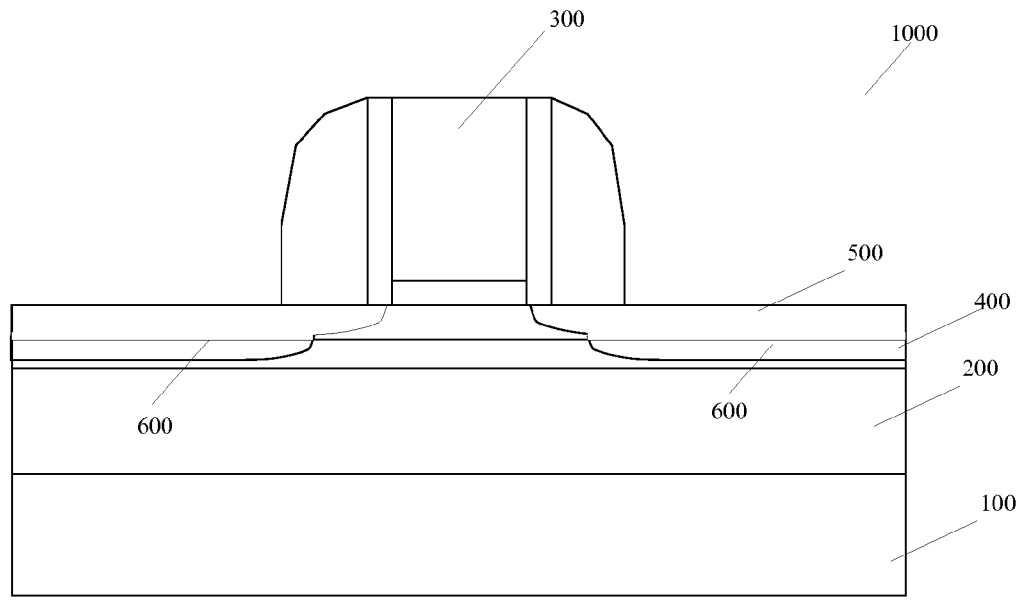
FIG. 1 is a cross-sectional view of a semiconductor structure according to a first embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intend to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it is appreciated for those skilled in the art to understand that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

In the present disclosure, after analyzed, BTBT leakage mainly comprises two types: BTBT leakage generated at the source/drain junction when the drain is applied with high bias voltage, and GIDL (gate-induced drain leakage) leakage, in which GIDL leakage refers to BTBT leakage generated at the gate-drain overlap when the drain is at high potential and the gate is at low potential. The particular embodiments of the present disclosure will be described below. The following embodiments may reduce at least one of the above-mentioned BTBT leakage. However, it should be noted that the following are described only for exemplary and/or illustration purpose rather than for limitations. It would be appreciated by those skilled in the art that changes and alternatives may be made without is departing from the technical principles of the disclosure, and these changes and alternatives should be within the scope of the disclosure.

First Embodiment

In this embodiment, a wide bandgap semiconductor material layer is formed below narrow bandgap semiconductor materials such as Ge or InSb, thus reducing BTBT leakage generated at the source/drain junction when the drain is applied with high voltage. It should be noted that, in this embodiment and those followed, the so-called wide bandgap semiconductor materials are referred only with respect to the narrow bandgap semiconductor materials such as Ge or InSb, i.e., the wide bandgap semiconductor material layer may be termed as the first bandgap semiconductor material layer and the narrow bandgap semiconductor material layer may be termed as the second bandgap semiconductor material layer which has a bandgap smaller than that of the first bandgap semiconductor material layer. For example, the bandgap of Si is not large by itself, but with respect to Ge, Si in each embodiment of the present disclosure may be referred to as a wide bandgap semiconductor material with respect to Ge.

FIG. 1 is a cross-sectional view of a semiconductor structure according to a first embodiment of the present disclosure. The semiconductor structure 1000 may comprise a substrate 100. The substrate 100 may be formed from any semiconductor substrate material, including, but not limited to, silicon, germanium, silicon germanide, SOI (silicon on insulator), silicon carbide, gallium arsenide, or any group III/V compound.

The semiconductor structure 1000 may further comprise a buffer layer or an insulation layer 200 formed on the substrate 100. In one embodiment of the present disclosure, the buffer layer 200 may be a relaxed SiGe virtual substrate layer. Certainly, the buffer layer may be formed from other materials. In another embodiment of the present disclosure, the insulation layer 200 may be formed from insulating materials such as $SiO_2$, thus more effectively reducing the BTBT leakage generated at the source/drain junction.

The semiconductor structure 1000 may further comprise a first strained wide bandgap semiconductor material layer 400 formed on the buffer layer or the insulation layer 200, and a strained narrow bandgap semiconductor material layer 500 formed on the first strained wide bandgap semiconductor material layer 400. In the embodiment of the present disclosure, the wide bandgap semiconductor materials may include, but are not limited to Si, SiC, GaN, InAlAs, InP or combinations thereof; and the narrow bandgap semiconductor materials may include, but are not limited to Ge, InSb, GaAs, InGaAs or combinations thereof. Certainly, other materials may be also used by those skilled in the art to achieve the present disclosure. However, without departing from the spirit of the disclosure, any alternative of the abovementioned materials may be fallen within the scope of the present disclosure.

According to an embodiment of the present disclosure, the first strained wide bandgap semiconductor material layer 400 may comprise a strained Si layer, and the strained narrow bandgap semiconductor material layer 500 may comprise a strained Ge or SiGe layer.

According to another embodiment of the present disclosure, the first strained wide bandgap semiconductor material layer 400 and the strained narrow bandgap semiconductor material layer 500 may comprise a strained SiGe layer respectively, but a concentration of Ge content in the strained narrow bandgap semiconductor material layer 500 may be greater than that of the Ge content in the first strained wide bandgap semiconductor material layer 400. Here, it should be noted that, it would be appreciated by those skilled in the art that, in this embodiment, the first strained wide bandgap semiconductor material layer 400 and the strained narrow bandgap semiconductor material layer 500 may be formed as a strained SiGe layer, and the concentration of Ge content in an upper portion of the strained SiGe layer may be larger than that of Ge content in a lower portion thereof by controlling the doping conditions, thus achieving the same technical effect as the present disclosure. In addition, it would be also appreciated by those skilled in the art that, the first strained wide bandgap semiconductor material layer 400 and the strained narrow bandgap semiconductor material layer 500 may also comprise a plurality of strained SiGe layers, the first strained wide bandgap semiconductor material layer 400 may comprise a multi-layered structure consisting of a plurality of strained Si layers and strained SiGe layers, or the strained narrow bandgap semiconductor material layer 500 may comprise a multi-layered structure consisting of a plurality of strained Ge layers and strained SiGe layers. Therefore, these may be considered as alternatives of the above embodiments of the present disclosure and consequently should be included in the scope of the present disclosure.

The semiconductor structure 1000 may also comprise a gate stack 300 formed on the strained narrow bandgap semiconductor material layer 500, and a source and a drain 600 formed in the first strained wide bandgap semiconductor material layer 400 and the strained narrow bandgap semiconductor material layer 500 respectively. In one embodiment of the present disclosure, the gate stack 300 may comprise a gate dielectric layer and a gate, preferably, a high-k gate dielectric layer and a metal gate. Certainly, other nitride or oxide dielectric layer or polycrystalline silicon grid may also be adopted in the present disclosure, and consequently should be included in the scope of the present disclosure. In other embodiments, the gate stack 300 may also comprise other material layer to improve certain other characteristics of the gate. It may be concluded that there are no limits on the structure of the gate stack, and thus any gate structure may be used accordingly. In another embodiment, one or more side walls may also be formed at both sides of the gate stack 300.

The first strained wide bandgap semiconductor material layer 400 is formed in the semiconductor structure, thus effectively reducing BTBT leakage current generated at the source/drain junction when the drain is applied with high voltage and reducing the influence of BTBT leakage. In addition, the BTBT leakage current may also be effectively reduced by the insulation layer 200 formed below the first strained wide bandgap semiconductor material layer 400.

Second Embodiment

This embodiment is substantially the same as the first Embodiment, except that in this embodiment, a wide bandgap semiconductor material layer is formed on the narrow bandgap semiconductor materials such as Ge or InSb, thus reducing GIDL leakage. Similarly, the wide bandgap semiconductor materials are referred with respect to the narrow bandgap semiconductor materials such as Ge or InSb.

Figure 2:
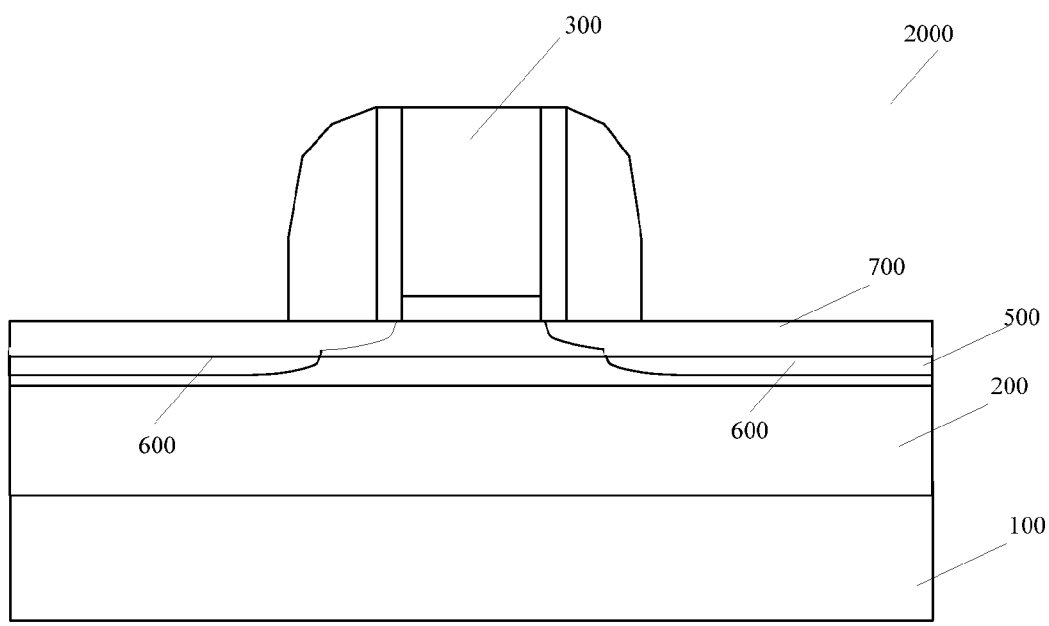
FIG. 2 is a cross-sectional view of a semiconductor structure according to a second embodiment of the present disclosure.

FIG. 2 is a cross-sectional view of a semiconductor structure according to a second embodiment of the present disclosure. The semiconductor structure 2000 is similar to the semiconductor structure 1000 in the first embodiment, and also comprises a substrate 100, a buffer layer or an insulation layer 200 formed on the substrate 100, a gate stack 300, etc., except that the semiconductor structure 2000 comprises a strained narrow bandgap semiconductor material layer 500 formed on the buffer layer or the insulation layer 200, and a second strained wide bandgap semiconductor material layer 700 formed on the strained narrow bandgap semiconductor material layer 500. A source and a drain 600 are formed in the strained narrow bandgap semiconductor material layer 500 and the second strained wide bandgap semiconductor material layer 700 respectively. In other embodiments of the present disclosure, other layers may be also formed between the buffer layer or the insulation layer 200 and the strained narrow bandgap semiconductor material layer 500 to improve the stress or contact condition therebetween etc. According to an embodiment of the present disclosure, the wide bandgap semiconductor materials may include, but are not limited to Si, SiC, GaN, InAlAs, InP or combinations thereof; and the narrow bandgap semiconductor materials may include, but are not limited to Ge, InSb, GaAs, InGaAs or combinations thereof. Preferably, in one embodiment of the present disclosure, the strained narrow bandgap semiconductor material layer 500 may comprise a strained Ge or SiGe layer, and the second strained wide bandgap semiconductor material layer 700 may comprise a strained Si layer. In another preferred embodiment, the strained narrow bandgap semiconductor material layer 500 and the second strained wide bandgap semiconductor material layer 700 may comprise a strained SiGe layer respectively, but a concentration of Ge content in the strained narrow bandgap semiconductor material layer 500 is greater than that of Ge content in the second strained wide bandgap semiconductor material layer 700. The semiconductor structure 2000 may effectively reduce the generation of GIDL leakage, thus reducing the negative influence of BTBT leakage.

Third Embodiment

This embodiment has the advantages of the above described embodiments, thus simultaneously reducing the generation of two kinds of BTBT leakage as described above. In addition, this embodiment also has an additional advantage, i.e., forming a hole potential well, thus increasing the mobility of the carriers and improving the performance of the semiconductor device.

Figure 3:
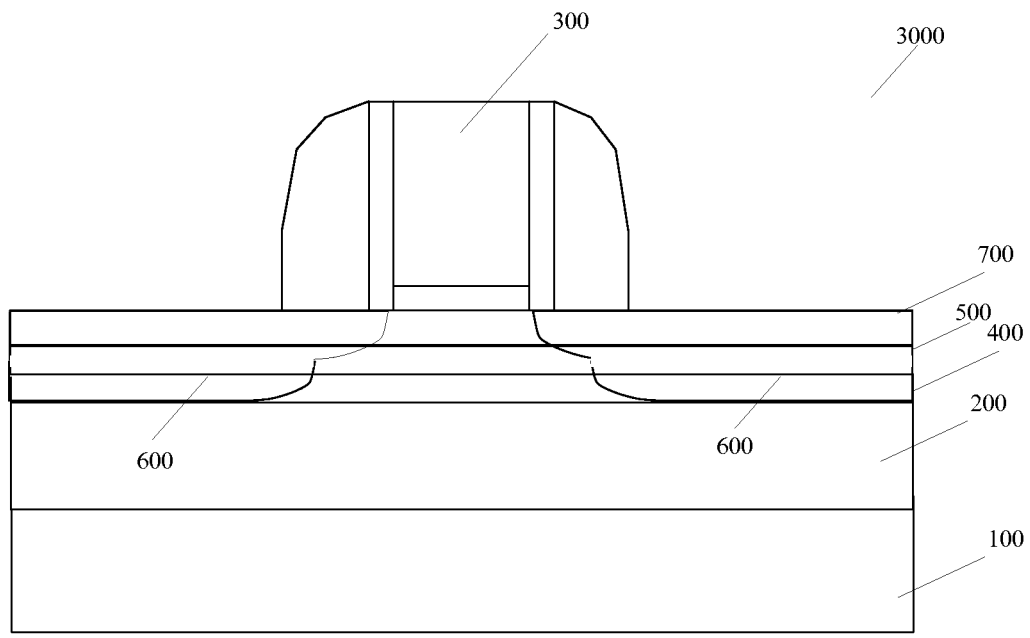
FIG. 3 is a cross-sectional view of a semiconductor structure according to a third embodiment of the present disclosure.

FIG. 3 is a cross-sectional view of a semiconductor structure according to a third embodiment of the present disclosure. The semiconductor structure 3000 is similar to the semiconductor structures 1000 and 2000, except that in this embodiment, the two kinds of BTBT leakage may be reduced by forming a wide bandgap semiconductor material layer on, below or around a narrow bandgap semiconductor material layer. As shown in FIG. 3, the difference between this embodiment and the above embodiments is that the semiconductor structure 3000 also comprises a first strained wide bandgap semiconductor material layer 400 formed on the buffer layer or the insulation layer 200, a strained narrow bandgap semiconductor material layer 500 formed on the first strained wide bandgap semiconductor material layer 400, and a second strained wide bandgap semiconductor material layer 700 formed on the strained narrow bandgap semiconductor material layer 500. In one embodiment of the present disclosure, the wide bandgap semiconductor materials may include, but are not limited to Si, SiC, GaN, InAlAs, InP or combinations thereof; and the narrow bandgap semiconductor materials may include, but are not limited to Ge, InSb, GaAs, InGaAs or combinations thereof. In the embodiment of the present disclosure, the wide bandgap semiconductor materials and the narrow bandgap semiconductor materials may be combined randomly. That is, the first strained wide bandgap semiconductor material layer 400 and the second strained wide bandgap semiconductor material layer 700 may be formed from identical wide bandgap semiconductor materials such as strained Si, or different wide bandgap semiconductor materials. For example, the first strained wide bandgap semiconductor material layer 400 may be formed from strained Si, and the second strained wide bandgap semiconductor material layer 700 may be formed from strained SiGe.

According to an embodiment of the present disclosure, the first strained wide bandgap semiconductor material layer 400 and the second strained wide bandgap semiconductor material layer 700 comprise a strained Si layer respectively, and the strained narrow bandgap semiconductor material layer 500 comprises a strained Ge or SiGe layer. In other preferred embodiment, the first wide bandgap semiconductor material layer 400, the second wide bandgap semiconductor material layer 700 and the strained narrow bandgap semiconductor material layer 500 comprises a strained SiGe layer, in which a concentration of Ge content in the strained narrow bandgap semiconductor material layer 500 is greater than that of Ge content in the first strained wide bandgap semiconductor material layer 400 and the second strained wide bandgap semiconductor material layer 700. In this embodiment, because the strained narrow bandgap semiconductor material layer 500 is used as a channel layer such as a strained Ge or SiGe layer, most of hole carriers may be accumulated in the strained narrow bandgap semiconductor material layer 500 with high mobility because of heterogeneous bandgap structure, thus effectively increasing the saturated current and improving the performance of the semiconductor device. In the present disclosure, the thickness and the doping of the first strained wide bandgap semiconductor material layer 400, the strained narrow bandgap semiconductor material layer 500 and the second strained wide bandgap semiconductor material layer 700 may be determined as desired. The thickness of the above layers will be described briefly in the following. For example, according to the Ge content in the relaxed SiGe virtual substrate layer, the thickness of each layer as described above may not exceed a critical thickness to avoid the introduction of new defects in the material layer because of the occurrence of relaxation. For example, the first strained wide bandgap semiconductor material layer 400 may have a thickness of about 3-5 nm, and may be as thick as possible without exceeding the critical thickness. The thickness of the strained narrow bandgap semiconductor material layer 500 may be about 3-10 nm without exceeding the critical thickness, and have to meet the requirement of the carrier transportation, and the strained narrow bandgap semiconductor material layer 500 may be is low-doped or non-doped to obtain high carrier mobility. The second strained wide bandgap semiconductor material layer 700 may have a thickness of about 2-5 nm, preferably, 3 nm, and may be heavily-doped to provide suitable carrier density. The above semiconductor structures proposed by the present disclosure may be applied not only to a vertical gate structure but also to a FinFET structure. Certainly, each embodiment of the present disclosure may also be used for other structures or novel semiconductor structures newly developed to reduce the BTBT leakage.

Figure 4:
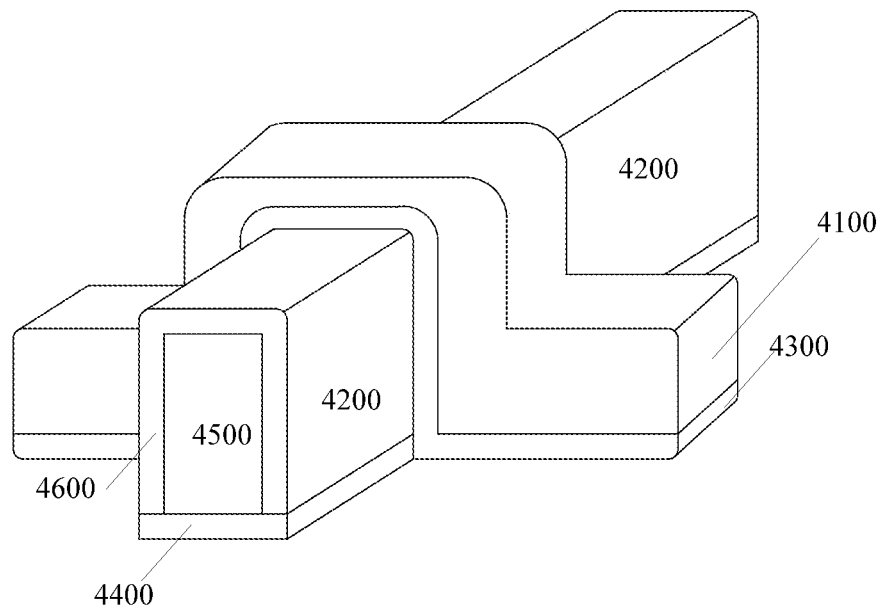
FIG. 4 is a schematic view of a FinFET structure according to an embodiment of the present disclosure.

FIG. 4 is a schematic view of a FinFET structure according to an embodiment of the present disclosure. The FinFET structure comprises a gate 4100 and a gate dielectric layer 4300, and a source/drain 4200. The source/drain 4200 comprises a first wide bandgap semiconductor material layer 4400 formed on a substrate (not shown), a strained narrow bandgap semiconductor material layer 4500 formed on the first wide bandgap semiconductor material layer 4400, and a second wide bandgap semiconductor material layer 4600 surrounding the strained narrow bandgap semiconductor material layer 4500. In one embodiment of the present disclosure, the first wide bandgap semiconductor material layer 4400 and the second wide bandgap semiconductor material layer 4600 may be a strained Si layer respectively, and the strained narrow bandgap semiconductor material layer 4500 may be a strained Ge or SiGe layer. In another embodiment of the present disclosure, the first wide bandgap semiconductor material layer 4400, the strained narrow bandgap semiconductor material layer 4500 and the second wide bandgap semiconductor material layer 4600 may be a strained SiGe layer respectively, but a concentration of Ge content in the strained narrow bandgap semiconductor material layer 4500 is greater than that of Ge content in the first strained wide bandgap semiconductor material layer 4400 and the second strained wide bandgap semiconductor material layer 4600.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A semiconductor structure, comprising:
    a substrate;
    a buffer layer or an insulation layer formed on the substrate;
    a first strained wide bandgap semiconductor material layer formed on the buffer layer or the insulation layer;
    a strained narrow bandgap semiconductor material layer formed on the first strained wide bandgap semiconductor material layer;
    a second strained wide bandgap semiconductor material layer formed on the strained narrow bandgap semiconductor material layer;
    a gate stack formed on the second strained wide bandgap semiconductor material layer; and
    a source and a drain formed in the first strained wide bandgap semiconductor material layer, the strained narrow bandgap semiconductor material layer and the second strained wide bandgap semiconductor material layer respectively.

2. The semiconductor structure according to claim 1, wherein the buffer layer comprises a relaxed SiGe virtual substrate layer.

3. The semiconductor structure according to claim 1 or 2, wherein the first strained wide bandgap semiconductor material layer and the second strained wide bandgap semiconductor material layer comprise a strained Si layer respectively, and the strained narrow bandgap semiconductor material layer comprises a strained Ge or SiGe layer.

4. The semiconductor structure according to claim 1 or 2, wherein each of the first strained wide bandgap semiconductor material layer, the strained narrow bandgap semiconductor material layer and the second strained wide bandgap semiconductor material layer comprises a stained SiGe layer, in which a concentration of Ge content in the strained narrow bandgap semiconductor material layer is greater than that of Ge content in the first strained wide bandgap semiconductor material layer and the second strained wide bandgap semiconductor material layer.

5. The semiconductor structure according to claim 1, wherein materials for forming the first and second strained wide bandgap semiconductor material layers comprise Si, SiC, GaN, InAlAs, InP or combinations thereof.

6. The semiconductor structure according to claim 1, wherein materials for forming the strained narrow bandgap semiconductor material layer comprise Ge, InSb, GaAs, InGaAs or combinations thereof.

7. A semiconductor structure, comprising:
    a substrate;
    a buffer layer or an insulation layer formed on the substrate;
    a first strained wide bandgap semiconductor material layer formed on the buffer layer or the insulation layer;
    a strained narrow bandgap semiconductor material layer formed on the first strained wide bandgap semiconductor material layer;
    a gate stack formed on the strained narrow bandgap semiconductor material layer; and
    a source and a drain formed in the first strained wide bandgap semiconductor material layer and the strained narrow bandgap semiconductor material layer respectively.

8. The semiconductor structure according to claim 7, further comprising a second strained wide bandgap semiconductor material layer between the strained narrow bandgap semiconductor material layer and the gate stack, wherein the source and the drain are formed in the second strained wide bandgap semiconductor material layer.

9. The semiconductor structure according to claim 7, wherein the buffer layer comprises a relaxed SiGe virtual substrate layer.

10. The semiconductor structure according to any one of claim 7, 8, or 9, wherein the first strained wide bandgap semiconductor material layer comprises a strained Si layer, and the strained narrow bandgap semiconductor material layer comprises a strained Ge or SiGe layer.

11. The semiconductor structure according to claim 10, wherein the second strained wide bandgap semiconductor material layer comprises a strained Si or SiGe layer.

12. The semiconductor structure according to any one of claim 7, 8, or 9, wherein the first strained wide bandgap semiconductor material layer and the strained narrow bandgap semiconductor material layer comprise a stained SiGe layer respectively, in which a concentration of Ge content in the strained narrow bandgap semiconductor material layer is greater than that of Ge in the first strained wide bandgap semiconductor material layer.

13. The semiconductor structure according to claim 12, wherein the second strained wide bandgap semiconductor material layer comprises a strained Si or SiGe layer, and when the second strained wide bandgap semiconductor material layer comprises a strained SiGe layer, a concentration of Ge content in the strained narrow bandgap semiconductor material layer is greater than that of Ge content in the second strained wide bandgap semiconductor material layer.

14. The semiconductor structure according to claim 7, wherein materials for forming the first and second strained wide bandgap semiconductor material layers comprise Si, SiC, GaN, InAlAs, InP or combinations thereof.

15. The semiconductor structure according to claim 7, wherein materials for forming the strained narrow bandgap semiconductor material layer comprise Ge, InSb, GaAs, InGaAs or combinations thereof.

* * * * *